(12) United States Patent
Evers et al.

(10) Patent No.: US 8,878,536 B2
(45) Date of Patent: Nov. 4, 2014

(54) MAGNETIC RESONANCE COIL DEVICE

(75) Inventors: Daniel Evers, Otterfing (DE); Björn Heismann, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 328 days.

(21) Appl. No.: 13/335,516

(22) Filed: Dec. 22, 2011

(65) Prior Publication Data

US 2012/0161773 A1    Jun. 28, 2012

(30) Foreign Application Priority Data

Dec. 23, 2010 (DE) .......................... 10 2010 064 096

(51) Int. Cl.
    *G01V 3/00*     (2006.01)
    *G01R 33/36*     (2006.01)

(52) U.S. Cl.
    CPC ................................. *G01R 33/3692* (2013.01)
    USPC ......................................... 324/322; 324/318

(58) Field of Classification Search
    USPC ......................................... 324/322, 318, 314
    See application file for complete search history.

(56) References Cited

U.S. PATENT DOCUMENTS

| 5,666,055 | A * | 9/1997 | Jones et al. ..................... 324/318 |
| 6,961,604 | B1 * | 11/2005 | Vahasalo et al. .............. 600/410 |
| 7,443,165 | B2 * | 10/2008 | Varjo ............................. 324/322 |
| 7,592,813 | B2 | 9/2009 | Boskamp et al. |
| 7,635,982 | B2 * | 12/2009 | Adachi et al. ................. 324/322 |
| 8,598,874 | B2 * | 12/2013 | Saes et al. ..................... 324/309 |

FOREIGN PATENT DOCUMENTS

| WO | WO 03/032002 A1 | 4/2003 |
| WO | WO 2006/008665 A1 | 1/2006 |

OTHER PUBLICATIONS

German Office Action dated Jul. 28, 2011 for corresponding German Patent Application No. DE 10 2010 064 096.4 with English translation.

* cited by examiner

*Primary Examiner* — Louis Arana

(74) *Attorney, Agent, or Firm* — Lempia Summerfield Katz LLC

(57) ABSTRACT

The present embodiments relate to a magnetic resonance coil device for receiving magnetic resonance signals. The magnetic resonance coil device includes a receiving antenna unit, a signal processing unit, a high-frequency unit, and a transmitting antenna unit for cable-free transmission of the received magnetic resonance signals and/or data to a data receiving unit. The magnetic resonance coil device includes at least one substantially uncovered region, and the transmitting antenna unit is arranged in the at least one substantially uncovered region.

20 Claims, 2 Drawing Sheets

MAGNETIC RESONANCE COIL DEVICE

This application claims the benefit of DE 10 2010 064 096.4, filed on Dec. 23, 2010.

BACKGROUND

The present embodiments relate to a magnetic resonance coil device for receiving magnetic resonance signals.

A magnetic resonance coil device for receiving magnetic resonance signals is known from U.S. Pat. No. 7,592,813 B2. The magnetic resonance coil device includes at least one receiving antenna unit, one signal processing unit, one high-frequency unit, and at least one transmitting antenna unit for cable-free transmission of the received magnetic resonance signals to a data receiving unit.

SUMMARY AND DESCRIPTION

The present embodiments may obviate one or more of the drawbacks or limitations in the related art. For example, a magnetic resonance coil device with interference-free, cable-free signal and/or data transfer is provided.

In one embodiment, a magnetic resonance coil device for receiving magnetic resonance signals includes a receiving antenna unit, a signal processing unit, a high-frequency unit and a transmitting antenna unit for cable-free transmission of the received magnetic resonance signals and/or data to a data receiving unit.

The magnetic resonance coil device includes at least one substantially uncovered region. The transmitting antenna unit is arranged in the at least one substantially uncovered region. A magnetic resonance coil device may be a device that is designed as a local magnetic resonance coil device and is formed on an anatomy of a chosen body part and/or body region (e.g., a chest region and/or an abdominal region of the patient). A magnetic resonance signal generated within the chosen body part and/or body region of the patient is received by the local magnetic resonance coil device. The at least one receiving antenna unit includes at least one receiving antenna and/or receiving antenna array for receiving the magnetic resonance signal. In this connection, an uncovered region may, for example, be a region of the magnetic resonance coil device that is not covered by the patient and/or other objects during a magnetic resonance measurement, so a data signal path of the signals and/or data emitted by the transmitting antenna unit is free of obstacles up to the data receiving unit. The data receiving unit may be arranged outside of the magnetic resonance coil device and may be encompassed by a magnetic resonance device. A substantially uncovered region may, for example, also be a region of the magnetic resonance coil device that has a particularly low probability of a covering (e.g., a hand and/or an arm of the patient). The substantially uncovered region may be formed, for example, by a region of a body matrix magnetic resonance coil device adjoining a patient's shoulder. Regions of the magnetic resonance coil device with a high probability of a covering are, for example, a region of the magnetic resonance coil device arranged around an abdominal region of the patient, since the region may be used for supporting the patient's arms and/or hands during a magnetic resonance measurement.

A magnetic resonance coil device may be provided by an embodiment that allows a substantially interference-free transmission mode for transmitting measurement data detected with the magnetic resonance coil device to the data receiving unit. Positioning of the magnetic resonance coil device during a magnetic resonance measurement may be independent of a cable length for a data transfer and/or independent of a position within a receiving region of the magnetic resonance device for receiving the patient. A position and/or arrangement of the substantially uncovered region, and therewith of the transmitting antenna unit within the magnetic resonance coil device, may be dependent on an embodiment and/or form of the magnetic resonance coil device. Therefore, an arrangement of the transmitting antenna unit in a body matrix magnetic resonance coil device may be different from an arrangement of the transmitting antenna unit in a leg and/or knee magnetic resonance coil device.

The substantially uncovered region is formed by an edge region. Covering of a region of the magnetic resonance coil device encompassing the transmitting antenna unit may be prevented, and cable-free data transfer may be maintained without interference in this way using the transmitting antenna unit.

Undesirable impairment of a data transfer due to interfering objects that are arranged between the transmitting antenna unit and the data receiving unit may be prevented if the uncovered region is formed at least partially by a supporting surface for supporting on an examination table during a magnetic resonance measurement. The data receiving unit may, for example, be arranged inside the examination table.

In one embodiment, the transmitting antenna unit is designed for sending digital data and/or signals. A proportion of a noise signal in the data and/or signals to be transferred may be minimized, and undesirable damping and/or attenuation of signals, as may occur, for example, with analog signals due to a large noise signal component, may be prevented in this way. A digital signal may, for example, be a signal that is formed from an analog signal. The digital signal describes a continuous characteristic of a physical variable by a quantization and sampling of the analog signal in a defined and stepped domain. In a chronological order, the digital signal is defined only at certain periodic instants or includes a change in the signal value.

The transmitting antenna unit is arranged at a spacing of at least 0.3 cm from the signal processing unit and/or the high-frequency unit. If the transmitting antenna unit includes a plurality of transmitting antenna elements, then each of the plurality of transmitting antenna elements is arranged at a spacing of at least 0.3 cm from the signal processing unit and/or the high-frequency unit. The transmitting antenna unit and/or the individual transmitting antenna elements of the transmitting antenna unit may be connected to the signal processing unit and/or the high-frequency unit using a data cable and/or a data line. The data cable and/or the data line have a length of at least 0.3 cm or at least of the minimum spacing. The transmitting antenna unit may be arranged within the magnetic resonance coil device so as to be physically separate from the signal processing unit and/or the high-frequency unit, and impairment of a transmission mode of the transmitting antenna unit may be minimized and/or prevented in this way.

The transmitting antenna unit and/or the individual transmitting antenna elements of the transmitting antenna unit are arranged at a spacing of at least 3 cm from the signal processing unit and/or the high-frequency unit (e.g., at a spacing of at least 5 cm or at a spacing of at least 10 cm from the signal processing unit and/or the high-frequency unit).

In one embodiment, the transmitting antenna unit and/or the individual transmitting antenna elements of the transmitting antenna unit are arranged at a spacing of at most half a length of the magnetic resonance coil device from the signal processing unit and/or the high-frequency unit. The maximum spacing between the transmitting antenna unit and the signal processing unit and/or the high-frequency unit is dependent on an embodiment and/or form of the magnetic resonance coil device. The maximum spacing between the transmitting antenna unit and the signal processing unit and/or the high-frequency unit is limited to 1 m, however. The transmitting antenna unit and/or the individual transmitting antenna elements of the transmitting antenna unit are arranged, for example, at a maximum spacing of approximately 75 cm or a maximum spacing of approximately 50 cm from the signal processing unit and/or the high-frequency unit. The form and compactness of the magnetic resonance coil device may be retained, and virtually interference-free, cable-free data transfer may be achieved at the same time.

The high-frequency unit is, for example, arranged at least partially together with the transmitting antenna unit in the uncovered region. A signal from the signal processing unit is guided using a data line and/or a data cable to the high-frequency unit. The data cable and/or the data line may be formed, for example, by a conventional data cable and/or by an optical fiber (e.g., from a glass fiber material).

In one embodiment, the transmitting antenna unit includes at least one transmitting antenna array with at least two transmitting antenna, and the at least two transmitting antenna are arranged on different uncovered regions. The probability of covering at least one region with one of the transmitting antennae may be reduced in this way.

In another embodiment, the transmitting antenna unit includes at least one transmitting antenna array with at least two transmitting antennae, and the at least two transmitting antennae are arranged so as to be bundled on a shared transmission location. A signal intensity of the signals and/or data to be transmitted may be increased by the at least two transmitting antennae. A shared transmission location may, in this connection, for example, be that the at least two transmitting antennae are arranged at a minimum spacing from each other (e.g., so as to adjoin each other) within the magnetic resonance coil device.

In one embodiment, a magnetic resonance system includes a magnetic resonance device and at least one magnetic resonance coil device.

The magnetic resonance device includes at least one examination table and one data receiving unit with at least one data receiving antenna for cable-free receipt of data and/or signals. The at least one data receiving antenna is at least partially surrounded by the examination table. A patient, together with the magnetic resonance coil device, may be positioned on the examination table for a magnetic resonance scan such that at least one transmitting antenna of a transmitting antenna unit and the at least one data receiving antenna may be arranged at a minimum spacing from each other. Probability of interference in the cable-free transfer of data and/or signals from the transmitting unit to the data receiving unit may be minimized. The minimum spacing is substantially formed by a thickness of a couch of the examination table, so no other objects that interfere with signal transmission may be arranged between the transmitting antenna unit and the data receiving unit. The at least one transmitting antenna of the transmitting antenna unit may be arranged on a region of the magnetic resonance coil device adjoining the examination table.

In one embodiment, the magnetic resonance device includes at least one wall surrounding a receiving region for receiving a patient, and a data receiving unit with at least one data receiving antenna for cable-free receipt of data and/or signals. The at least one data receiving antenna is at least partially encompassed by the wall surrounding the receiving region. Owing to a small spacing between the transmitting antenna unit and the at least one data receiving antenna, a low-loss, cable-free signal transfer may be achieved between the magnetic resonance coil device and a data receiving unit of the magnetic resonance device.

DETAILED DESCRIPTION OF THE DRAWINGS

Figure 1:
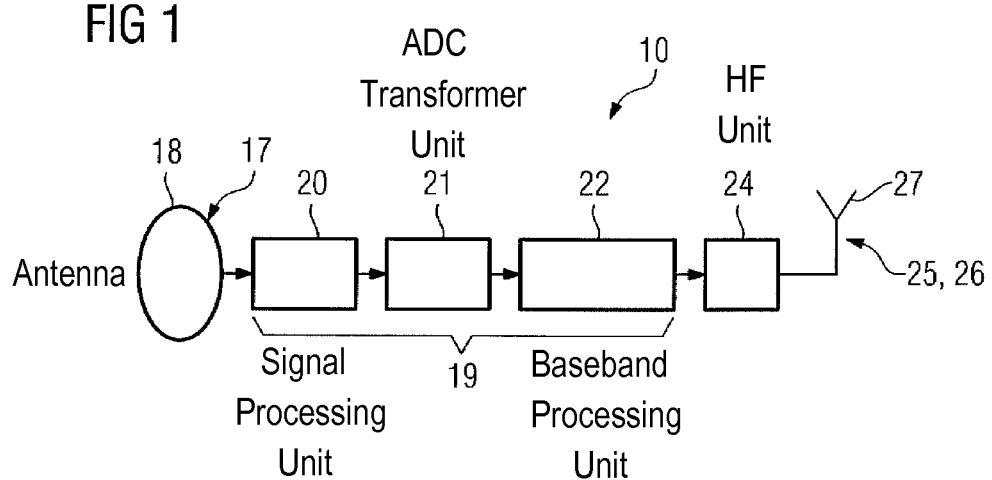
FIG. 1 shows a basic construction of one embodiment of a magnetic resonance coil device.

FIG. 1 schematically shows a construction of one embodiment of a magnetic resonance coil device 10. The magnetic resonance coil device 10 is formed by a local magnetic resonance coil device that, by way of example, is formed by a leg-magnetic resonance coil device (FIG. 3), a body matrix magnetic resonance coil device (FIG. 2), a chest-magnetic resonance coil device, other local magnetic resonance coil devices, or a combination thereof. Magnetic resonance signals are detected by the magnetic resonance coil device 10. The magnetic resonance coil device 10 is arranged around a region 12 of a patient 11 to be examined for this purpose.

The magnetic resonance signals are created during operation of a magnetic resonance device 13 in the region 12 of the patient 11 to be examined. A constant and homogeneous main magnetic field 15 is generated using a main magnet 14 of the magnetic resonance device 13. In the region 12 of the patient 11 to be examined, the main magnetic field 15 leads to a magnetization of nucleon spins. The nucleon spins orient along the main magnetic field 15. The nucleon spins are excited and deflected from the magnetization by high-frequency pulses. The high-frequency pulses are generated and emitted by a high-frequency coil unit 16. The nucleon spins generate a magnetic resonance signal that is detected by the magnetic resonance coil device 10.

Figure 4:
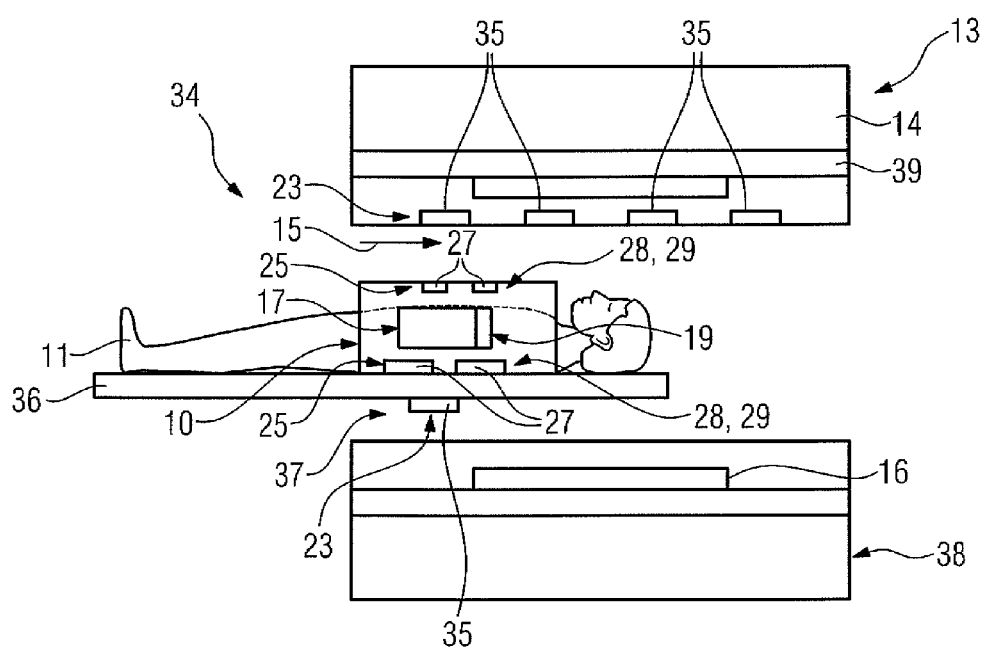
FIG. 4 shows one embodiment of a magnetic resonance system with a magnetic resonance device.

For receiving the magnetic resonance signals, the magnetic resonance coil device 10 includes a receiving antenna unit 17. The receiving antenna unit 17 may include at least one receiving antenna 18 and/or one receiving antenna array with a plurality of receiving antennae 18. The magnetic resonance coil device 10 also includes a signal processing unit 19 that includes an analog signal processing unit 20, an ADC transformer unit 21, and a baseband processing unit 22. Inside the signal processing unit 19, the detected analog magnetic resonance signals are amplified and, for example, converted into digital signals and/or data. The digital signals and/or data may be coded and/or modulated inside the signal processing unit 19 for cable-free transmission and/or transfer of the digital signals and/or data to a data receiving unit 23 of the magnetic resonance device 13 (FIG. 4).

The magnetic resonance coil device 10 also includes a high-frequency unit 24 and a transmitting antenna unit 25. The digital signals and/or data are transferred from the signal processing unit 19 to the high-frequency unit 24 and, inside the high-frequency unit 24, are prepared in terms of high frequency such that the digital signals and/or data may be emitted by the transmitting antenna unit 25. In one embodiment, the transmitting antenna unit 25 includes a transmitting antenna array 26 with a plurality of transmitting antennae 27 for the cable-free transfer of the high-frequency digital signals and/or data. Alternatively the transmitting antenna unit 25 may also include a single transmitting antenna 27.

To suppress undesirable interference in the cable-free transfer of the high-frequency digital data and/or signals from the magnetic resonance coil device 10 to the data receiving unit 23 of the magnetic resonance device 13, the transmitting antenna unit 25 is arranged in a substantially uncovered region 28 of the magnetic resonance coil device 10. The substantially uncovered region 28 of the magnetic resonance coil device 10 is a region that has an extremely low probability of covering during a magnetic resonance measurement. A section of a body matrix magnetic resonance coil device arranged around a chest region and/or an abdominal region of the patient 11 has a high probability of covering since this section of the magnetic resonance coil device 10 is used, for example, for supporting arms and/or hands of the patient 11 during the magnetic resonance measurement. The substantially uncovered region 28 is formed by an edge region 29 of the magnetic resonance coil device 10. By way of example, the transmitting antenna unit 25 may be at least partially arranged in the edge region 29 of the body matrix magnetic resonance coil device arranged around a shoulder of the patient 11 and/or in an edge region 29 of the body matrix magnetic resonance coil device arranged around the pelvis of the patient 11 (see FIG. 2). A data and/or signal transfer path from the transmitting antenna unit 25 of the magnetic resonance coil device 10 to the data receiving unit 23 of the magnetic resonance device 13 is in this way free of objects interfering with the data transfer and/or the signal transfer, which, for example, may cause weakening of the signal to be transferred.

The signal processing unit 19 and the receiving antenna unit 17 are, for example, compactly arranged with a minimum spacing from each other (e.g., as is known from a conventional magnetic resonance coil device 10). The transmitting antenna unit 25 is arranged inside the magnetic resonance coil device 10 at a minimum spacing from the signal processing unit 19. For the arrangement of the transmitting antenna unit 25 inside the magnetic resonance coil device 10, a potential covering and accompanying interference in the cable-free transfer of the high-frequency, digital signals and/or data from the transmitting antenna unit 25 to the data receiving unit 23 of the magnetic resonance device 13 is taken into account, while the arrangement of the receiving antenna unit 17 and/or of the signal processing unit 19 inside the magnetic resonance coil device 10 is not.

Figure 2:
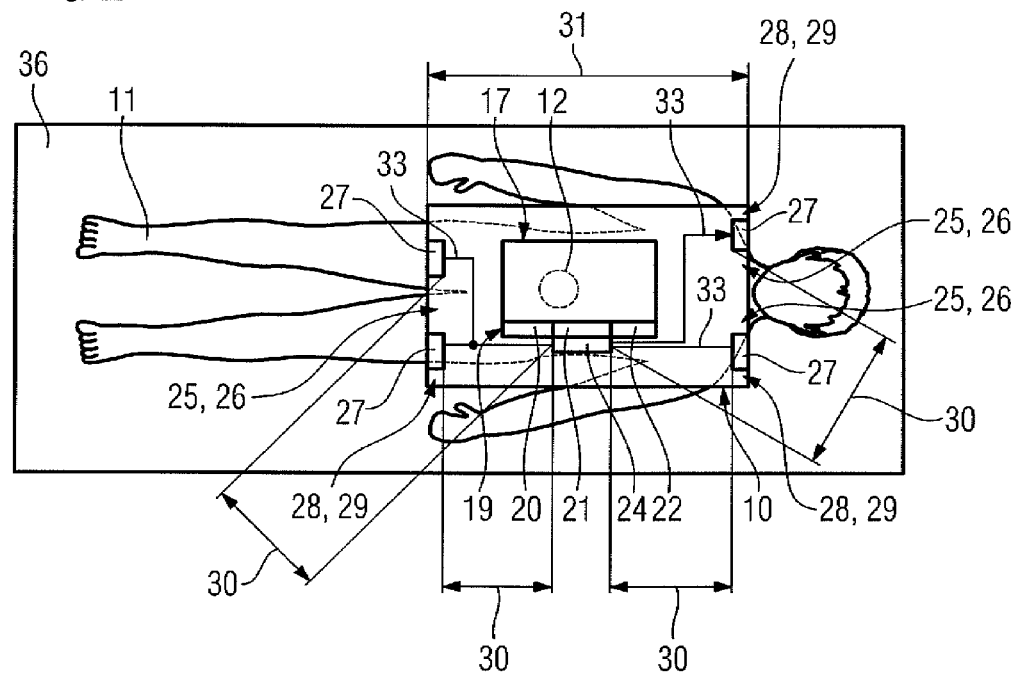
FIG. 2 shows one embodiment of a magnetic resonance coil device.

FIG. 2 shows one embodiment of the magnetic resonance coil device 10 formed by the body matrix magnetic resonance coil device. The high-frequency unit 24 is also arranged at a minimum spacing from the signal processing unit 19, so the receiving antenna unit 17 together with the signal processing unit 19 and the high-frequency unit 24 are arranged, for example, compactly inside the magnetic resonance coil device 10. The transmitting antenna array 26 and/or the individual transmitting antennae 27 of the transmitting antenna array 26 have a spacing 30 from the high-frequency unit 24 that is at least 0.3 cm. The spacing 30 between the transmitting antenna array 26 and/or the individual transmitting antennae 27 of the transmitting antenna array 26 and the high-frequency unit 24 is, for example, at least 3 cm (e.g., at least 5 cm). A minimum spacing 30 between the high-frequency unit 24 and the transmitting antenna array 26 or the individual transmitting antennae 27 may also be more than 5 cm (e.g., 10 cm and/or 20 cm). The minimum spacing 30 is dependent on a form and/or embodiment of the magnetic resonance coil device 10.

The transmitting antenna unit 25 and/or the individual transmitting antennae 27 of the transmitting antenna array 26 are arranged at a spacing 30 of at most a length 31 (e.g., a maximum of half the length 31) of the magnetic resonance coil device 10 from the high-frequency unit 24, as seen in FIG. 2. The maximum spacing 30 between the transmitting antenna unit 25 and/or the individual transmitting antennae 27 of the transmitting antenna array 26 and the high-frequency unit 24 is therefore dependent on a form and/or embodiment of the magnetic resonance coil device 10. The maximum spacing 30 between the transmitting antenna unit 25 and/or the individual transmitting antennae 27 of the transmitting antenna array 26 and the high-frequency unit 24 in the case of a body matrix magnetic resonance coil device may, in this way, be greater than the maximum spacing 30 in the case of a leg and/or knee magnetic resonance coil device. The spacing 30 between the high-frequency unit 24 and the transmitting antenna array 26 or the individual transmitting antennae 27 is at most 1 m (e.g., a maximum of 75 cm or 50 cm). A data transfer and/or signal transfer between the high-frequency unit 24 and the transmitting antenna array 26 takes place using a data line 33. The data line 33 may be formed in this connection by a conventional data cable and/or an optical fiber that is at least partially formed from a glass fiber material and/or other data transfer devices. A length of the data line 33 may match at least the minimum spacing between the transmitting antenna unit 25 and the high-frequency unit 24.

During operation of the magnetic resonance coil device 10, the transmitting antennae 27 of the transmitting antenna array 26 each transmit the same high-frequency digital data signal to the data receiving unit 23 of the magnetic resonance device 13. A redundant transmission mode between the magnetic resonance coil device 10 and the data receiving unit 23 of the magnetic resonance device 13, and receipt of the digital data signal may be provided in this way. The transmitting antennae 27 of the transmitting antenna array 26 are arranged on different uncovered regions 28 of the magnetic resonance coil device 10. The transmitting antennae 27 of the transmitting antenna array 26 may also be arranged so as to be bundled on an uncovered region 28 of the magnetic resonance coil device 10, so a signal intensity of the high-frequency digital data signal is increased.

Figure 3:
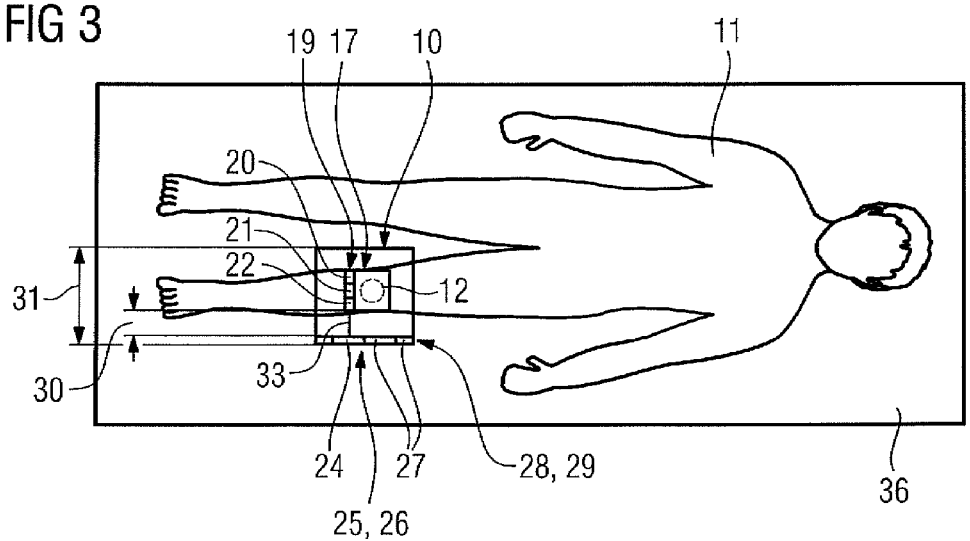
FIG. 3 shows another embodiment of the magnetic resonance coil device.

FIG. 3 shows one embodiment of the magnetic resonance coil device 10 shown in FIG. 2. The magnetic resonance coil device 10 is formed by a leg magnetic resonance coil device. The high-frequency unit 24 is arranged together with the transmitting antenna unit 25 in the uncovered region 28 of the magnetic resonance coil device 10. The transmitting antenna unit 25 together with the high-frequency unit 24 has a spacing 30 from the signal processing unit 19 that is at least 0.3 cm. The spacing 30 between the signal processing unit 19 and the high-frequency unit 24 together with the transmitting antenna unit 25 is, for example, at least 3 cm (e.g., at least 5 cm). The minimum spacing 30 between the signal processing unit 19 and the transmitting antenna unit 25 or the high-frequency unit 24 may also be more than 5 cm (e.g., 10 cm and/or 20 cm).

A maximum spacing 30 between the signal processing unit 19 and the high-frequency unit 24 or the transmitting antenna unit 25 is at most a length 31 or, for example, at most half a length 31 of the magnetic resonance coil device 10, as is shown in FIG. 3. The maximum spacing 30 between the signal processing unit 19 and the high-frequency unit 24 is dependent on a form and/or embodiment of the magnetic resonance coil device 10. In one embodiment, the spacing 30 between the signal processing unit 19 and the high-frequency unit 24 is at most 40 cm (e.g., 30 cm or less or 20 cm or less).

A data transfer and/or signal transfer between the signal processing unit 19 and the high-frequency unit 24 takes place using a data line 33. The data line 33 may be formed by a conventional data cable and/or an optical fiber that is formed at least partially from a glass fiber material and/or other data transfer devices. A length of the data line 33 matches, for example, at least the minimum spacing between the transmitting antenna unit 25 or the high-frequency unit 24 and the signal processing unit 19.

The arrangement of the high-frequency unit 24 together with the transmitting antenna unit 25 in at least one uncovered region 28 of the magnetic resonance coil device 10 is not limited to the exemplary embodiment in FIG. 3, however. The arrangement of the transmitting antenna unit 25 in the uncovered region 28 separate from the high-frequency unit 24, which together with the signal processing unit 19 and the receiving antenna unit 17 are arranged at a minimum spacing from the transmitting antenna unit 25, is not limited to the exemplary embodiment in FIG. 2. A person skilled in the art may consider the individual features from the different exemplary embodiments individually and combine the individual features to form other embodiments. Components, features and functions that remain substantially the same in the exemplary embodiments in FIGS. 2 and 3 may be denoted by the same reference numerals, the description relating to FIG. 3 being substantially limited to the differences from the description of FIG. 2. Reference is made to the description of the exemplary embodiment in FIG. 2 with regard to identical components, features and functions.

FIG. 4 shows a magnetic resonance system 34 with the magnetic resonance device 13 and the magnetic resonance coil device 10. The magnetic resonance device 13 includes the data receiving unit 23 with a plurality of data receiving antennae 35. The data receiving unit 23 may include further units and elements not shown in more detail in FIG. 4 (e.g., an evaluation unit). At least one of the data receiving antennae 35 is arranged in an examination table 36, on which the patient 11 is positioned for a magnetic resonance measurement, of the magnetic resonance device 13. Using the examination table 36, the patient 11 is introduced into a receiving region 37 of the magnetic resonance device 13. The receiving region 37 is surrounded by a magnet unit 38 including the main magnet 14, a gradient unit 39, and the high-frequency coil unit 16. To obtain an optimally small spacing between the at least one data receiving antenna 35 of the data receiving unit 23, arranged inside the examination table 36, and the transmitting antenna 27 of the transmitting antenna array 26 of the magnetic resonance coil device 10, the transmitting antennae 27 are arranged on a side of the magnetic resonance coil device 10 adjoining the examination table 36. The side adjoining the examination table 36 is formed by a supporting surface of the magnetic resonance coil device 10. This may be formed, by way of example, on the back of a body matrix magnetic resonance coil device or a leg magnetic resonance coil device, for example. The patient 11, together with the magnetic resonance coil device 10, may be positioned on the examination table 36 such that the spacing between the transmitting antenna 27 of the transmitting antenna array 26 and the data receiving antenna 35 of the data receiving unit 23 is substantially formed by a thickness of a couch (e.g., a bed) of the examination table 36.

The data receiving unit 23 of the magnetic resonance device 13 includes further data receiving antennae 35 that are arranged around the receiving region 37. The data receiving antennae 35 may be integrated, for example, inside a wall, surrounding the receiving region 37, along a longitudinal direction and/or a peripheral direction of the receiving region 37. A plurality of data receiving antennae 35 is arranged distributed around the receiving region 37, so, independently of a measuring position of the patient 11 together with the magnetic resonance coil device 10 inside the receiving region 37, optimal data receipt for a cable-free data transfer and/or signal transfer from the transmitting antenna array 26 to the data receiving unit 23 during operation of the magnetic resonance device 13 is achieved. A shortest spacing between one of the transmitting antenna 27 of the transmitting antenna array 26 and one of the data receiving antennae 35 of the data receiving unit 23 may be at most 20 cm or at most 15 cm.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil device for receiving magnetic resonance signals, the magnetic resonance coil device comprising:
   a receiving antenna unit;
   a signal processing unit in communication with the receiving antenna unit;
   a high-frequency unit in communication with the signal processing unit;
   a transmitting antenna unit in communication with the high-frequency unit, the transmitting antenna unit being configured for cable-free transmission of the received magnetic resonance signals, data, or the received magnetic resonance signals and the data to a data receiving unit, and including at least two transmitting antennas, each transmitting antenna of the at least two transmitting antennas operable to transmit a same high-frequency digital data signal; and
   at least one region of the magnetic resonance coil device positioned within the magnetic resonance coil device such that the at least one region is substantially uncoverable by an object to be measured with the magnetic resonance coil device, wherein the transmitting antenna unit is arranged in the at least one substantially uncovered region.

2. The magnetic resonance coil device as claimed in claim 1, wherein the at least one substantially uncovered region is formed by an edge region.

3. The magnetic resonance coil device as claimed in claim 1, wherein the at least one substantially uncovered region is formed at least partially by a supporting surface for support on an examination table during a magnetic resonance measurement.

4. The magnetic resonance coil device as claimed in claim 1, wherein the transmitting antenna unit is operable to transmit digital signals.

5. The magnetic resonance coil device as claimed in claim 1, wherein the transmitting antenna unit is arranged at a spacing of at least 0.3 cm from the signal processing unit, the high-frequency unit, or the signal processing unit and the high-frequency unit.

6. The magnetic resonance coil device as claimed in claim 1, wherein the transmitting antenna unit is arranged at a spacing of at least 3 cm from the signal processing unit, the high-frequency unit, or the signal processing unit and the high-frequency unit.

7. The magnetic resonance coil device as claimed in claim 1, wherein the transmitting antenna unit is arranged at a maximum spacing of half a length of the magnetic resonance coil device from the signal processing unit, the high-frequency unit, or the signal processing unit and the high-frequency unit.

8. The magnetic resonance coil device as claimed in claim 1, wherein the high-frequency unit is arranged at least partially together with the transmitting antenna unit in the at least one substantially uncovered region.

9. The magnetic resonance coil device as claimed in claim 1, wherein the transmitting antenna unit comprises at least one transmitting antenna array with at least two transmitting antennae, and
    wherein the at least one substantially uncovered region comprises a plurality of substantially uncovered regions, the at least two transmitting antennae being arranged on different substantially uncovered regions of the plurality of substantially uncovered regions.

10. The magnetic resonance coil device as claimed in claim 1, wherein the transmitting antenna unit comprises at least one transmitting antenna array with at least two transmitting antennae, and
    wherein the at least two transmitting antennae are arranged so as to be bundled on a shared transmission location.

11. The magnetic resonance coil device as claimed in claim 2, wherein the transmitting antenna unit is operable to transmit digital signals.

12. The magnetic resonance coil device as claimed in claim 3, wherein the transmitting antenna unit is operable to transmit digital signals.

13. The magnetic resonance coil device as claimed in claim 2, wherein the transmitting antenna unit is arranged at a spacing of at least 0.3 cm from the signal processing unit, the high-frequency unit, or the signal processing unit and the high-frequency unit.

14. The magnetic resonance coil device as claimed in claim 3, wherein the transmitting antenna unit is arranged at a spacing of at least 3 cm from the signal processing unit, the high-frequency unit, or the signal processing unit and the high-frequency unit.

15. The magnetic resonance coil device as claimed in claim 4, wherein the transmitting antenna unit is arranged at a maximum spacing of half a length of the magnetic resonance coil device from the signal processing unit, the high-frequency unit, or the signal processing unit and the high-frequency unit.

16. The magnetic resonance coil device as claimed in claim 5, wherein the high-frequency unit is arranged at least partially together with the transmitting antenna unit in the at least one substantially uncovered region.

17. A magnetic resonance system comprising:
    a magnetic resonance device; and
    at least one magnetic resonance coil device for receiving magnetic resonance signals, the at least one magnetic resonance coil device comprising:
        a receiving antenna unit;
        a signal processing unit in communication with the receiving antenna unit;
        a high-frequency unit in communication with the signal processing unit;
        a transmitting antenna unit in communication with the high-frequency unit, the transmitting antenna unit being configured for cable-free transmission of the received magnetic resonance signals, data, or the received magnetic resonance signals and the data to a data receiving unit, and including at least two transmitting antennas, each transmitting antenna of the at least two transmitting antennas operable to transmit a same high-frequency digital data signal; and
        at least one region of the at least one magnetic resonance coil device positioned within the at least one magnetic resonance coil device such that the at least one region is substantially uncoverable by an object to be measured with the at least one magnetic resonance coil device, wherein the transmitting antenna unit is arranged in the at least one substantially uncovered region.

18. The magnetic resonance system as claimed in claim 17, wherein the magnetic resonance device comprises:
    at least one examination table; and
    a data receiving unit comprising at least one data receiving antenna configured for cable-free receipt of data, signals, or data and signals, the at least one data receiving antenna being at least partially encompassed by the examination table.

19. The magnetic resonance system as claimed in claim 17, wherein the magnetic resonance device comprises:
    at least one wall surrounding a receiving region for receiving a patient; and
    a data receiving unit comprising at least one data receiving antenna configured for cable-free receipt of data, signals, or data and signals, the at least one data receiving antenna being at least partially encompassed by the wall surrounding the receiving region.

20. The magnetic resonance system as claimed in claim 18, wherein the magnetic resonance device further comprises at least one wall surrounding a receiving region for receiving a patient, and
    wherein the at least one data receiving antenna is at least partially encompassed by the wall surrounding the receiving region.

* * * * *